(12) United States Patent
Maa et al.

(10) Patent No.: US 6,780,796 B2
(45) Date of Patent: Aug. 24, 2004

(54) METHOD OF FORMING RELAXED SIGE LAYER

(75) Inventors: Jer-Shen Maa, Vancouver, WA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/625,015

(22) Filed: Jul. 22, 2003

(65) Prior Publication Data

US 2004/0087119 A1 May 6, 2004

Related U.S. Application Data

(63) Continuation-in-part of application No. 10/062,319, filed on Jan. 31, 2002.

(51) Int. Cl.[7] .............................................. H01L 21/324
(52) U.S. Cl. ........................ 438/795; 438/796; 438/522
(58) Field of Search ............................... 438/795, 796, 438/798, 518, 520, 522, 197

(56) References Cited

U.S. PATENT DOCUMENTS

| | | | |
|---|---|---|---|
| 5,877,070 A | 3/1999 | Goesele et al. | |
| 6,464,780 B1 | 10/2002 | Mantl et al. | |
| 6,486,008 B1 | 11/2002 | Lee | |
| 6,562,703 B1 | 5/2003 | Maa et al. | |
| 6,573,126 B2 * | 6/2003 | Cheng et al. | 438/149 |
| 2004/0012075 A1 * | 1/2004 | Bedell et al. | 257/616 |
| 2004/0048450 A1 * | 3/2004 | Tweet et al. | 438/478 |

OTHER PUBLICATIONS

G.F. Cerofolini et al., *Hydrogen–related Complexes as the Stressing Species in High–fluence, Hydrogen–implanted, Single–crystal Silicon*, Physical Review B, vol. 46, p. 2061 (1992).

Deepak K. Nayak et al., *High–Mobility Strained–Si PMOS-FETs*, IEEE Transactions on Electron Devices, vol. 43, 1709 (1996).

Aditya Agarwal et al., *Efficient Production of Silicon–on–Insulator Films by Co–implantation of $He^+$ with $H^+$*, Proceedings of the 1997 IEEE International SOI Conference, p. 44, (1997).

M.K. Weldon et al., *On the Mechanism of the Hydrogen–Induced Exfoliation of Silicon*, J. Vac. Sci. Technol. B. 15, 1065, (1997).

S. Mantl et al., *Strain Relaxation of Epitaxial SiGe Layers on Si(100) Improved by Hydrogen Implantation*, Nuclear Instruments and Methods in Physics Research B 147, 29, (1999).

H. Trinkaus et al., *Strain Relaxation Mechanism for Hydrogen–Implanted $Si_{1-x}Ge_x/Si(100)$ Heterostructures*, Appl. Phys. Lett., 76, 3552, (2000).

(List continued on next page.)

Primary Examiner—Tuan H. Nguyen
(74) Attorney, Agent, or Firm—David C. Ripma; Matthew D. Rabdau

(57) ABSTRACT

A method of forming a SiGe layer having a relatively high Ge content includes preparing a silicon substrate; depositing a layer of strained SiGe to a thickness of between about 100 nm to 500 nm, wherein the Ge content of the SiGe layer is equal to or greater than 20%, by molecular weight; implanting $H_2^+$ ions into the SiGe layer; irradiating the substrate and SiGe layer, to relax the SiGe layer; and depositing a layer of tensile-strained silicon on the relaxed SiGe layer to a thickness of between about 5 nm to 30 nm.

16 Claims, 3 Drawing Sheets

OTHER PUBLICATIONS

K. Rim et al., *Strained Si NMOSFETs for High Performance CMOS Technology*, 2001 Symposium on VLSI Technology Digest of Technical Papers, p. 59, (IEEE 2001).

Jason T.S. Lin et al., *Nova Cut™ Process: Fabrication of Silicon–on Insulator Materials*, 2002 IEEE International SOI Conference, Williamsburg, Virginia, (2002).

M. Luysberg et al., *Effect of helium ion implantation and annealing on the relaxation behavior of pseudomorphic $Si_{1-x}Ge_x$ Buffer Layers on Si(100) substrates*, Journal of Applied Physics, vol. 92, No. 8 (2002).

* cited by examiner

METHOD OF FORMING RELAXED SIGE LAYER

RELATED APPLICATION

This application is a continuation-in-part of U.S. patent application Ser. No. 10/062,319 filed Jan. 31, 2002, for Method to form relaxed SiGe layer with high Ge content.

FIELD OF THE INVENTION

This invention relates to high speed CMOS integrated circuits, and specifically to the incorporation of an irradiated relaxed SiGe layer in such an IC.

BACKGROUND OF THE INVENTION

In enhanced mobility MOSFET device applications, thick, relaxed $Si_{1-x}Ge_x$ buffer layers have been used as virtual substrates for thin, strained silicon layers to increase carrier mobility for both NMOS, K. Rim et al., *Strained Si NMOSFETs for High Performance CMOS Technology*, 2001 Symposium on VLSI Technology Digest of Technical Papers, p. 59, (IEEE 2001), and PMOS, Deepak K. Nayak et al., *High-Mobility Strained-Si PMOSFETs*, IEEE Transactions on Electron Devices, Vol. 43, 1709 (1996), devices. Compared with bulk silicon devices, enhancement in electron mobility of 70% for devices with $L_{eff}$<70 nm have been reported, Rim et al., supra. Enhancements of up to 40% in high-field hole mobility for long-channel devices have also been reported. Nayak et al., supra. The predominant technique currently in use to produce a high quality relaxed $Si_{1-x}Ge_x$ buffer layer is the growth of a several $\mu$m thick, compositionally graded, layer, Rim et al. and Nayak et al., supra. However, the density of threading dislocations using this technique is still high, e.g., >$10^6$ cm$^{-2}$. In addition, the integration of a several $\mu$m thick $Si_{1-x}Ge_x$ layer into MOS device fabrication is not very practical because of high fabrication costs.

Alternative methods to efficiently relax strained SiGe layers on silicon have been attempted, based on the SmartCut™ process, employing atomic hydrogen implantation, M. K. Weldon et al., *On the Mechanism of the Hydrogen-Induced Exfoliation of Silicon*, J. Vac. Sci. Technol. B. 15, 1065, (1997), for the fabrication of high-quality silicon-on-insulator (SOI) wafers, atomic hydrogen (H$^+$) implantation, followed by an appropriate anneal, has been used to increase the degree of SiGe relaxation and to reduce the density of threading dislocations, S. Mantl et al., *Strain Relaxation of Epitaxial SiGe Layers on Si(100) Improved by Hydrogen Implantation*, Nuclear Instruments and Methods in Physics Research B 147, 29, (1999), and U.S. Pat. No. 6,464,780 B1, granted Oct. 15, 2002, to Mantl et al., for *Method for the Production of a Monocrystalline Layer on a Substrate with a Non-Adapted Lattice and Component Containing One or Several such Layers*, H. Trinkaus et al., *Strain Relaxation Mechanism for Hydrogen-Implanted $Si_{1-x}Ge_x/Si(100)$ Heterostructures*, Appl. Phys. Lett., 76, 3552, (2000), and the above-identified related U.S. patent application. Helium implantation, followed by an anneal step, has also been explored to promote relaxation in SiGe films, M. Luysberg et al., *Effect of helium ion implantation and annealing on the relaxation behavior of pseudomorphic $Si_{1-x}Ge_x$ Buffer Layers on Si(100) substrates*, Journal of Applied Physics, Vol. 92, No. 8 (2002).

In addition to the SmartCut™ process, another method for splitting wafers for SOI fabrication is the co-implantation of boron and H$_2^+$ ions, U.S. Pat. No. 5,877,070, granted Mar. 2, 1999, to Goesele et al., for *Method for the Transfer of Thin Layers of Monocrystalline Material to a Desirable Substrate*. Based on this, some of us have proposed the use of boron and H$^+$ to relax SiGe films. Additionally, H$^+$ has also been co-implanted with He for the purpose of SOI fabrication, Aditya Agarwal et al., *Efficient Production of Silicon-on-Insulator Films by Co-implantation of He$^+$ with H$^+$*, Proceedings of the 1997 IEEE International SOI Conference, p. 44, (1997).

All known methods which use the implantation of hydrogen to promote relaxation of strained SiGe layers have utilized ionized atomic hydrogen, H$^+$. However, this implantation process is very expensive because of the long time required for the implantation process. The use of singly ionized molecular hydrogen, H$_2^+$, has been suggested to reduce the time and cost because the implantation would be done at twice the energy and half the current required for H$^+$ implantation, Huang et al., and G. F. Cerofolini et al., *Hydrogen-related Complexes as the Stressing Species in High-fluence, Hydrogen-implanted, Single-crystal Silicon*, Physical Review B, vol. 46, p. 2061 (1992). Moreover, co-implantation of boron and singly ionized molecular hydrogen, H$_2^+$, has been shown to be effective for SOI fabrication, U.S. Pat. No. 5,877,070, and Huang et al. It follows, therefore, that the implantation of H$_2^+$ alone, U.S. Pat. No. 6,562,703 B1, to Maa et al., granted May 13, 2003, for Molecular hydrogen implantation method for forming a relaxed silicon germanium layer with high germanium content, or with boron, helium, silicon, or other species, for the purpose of relaxing strained SiGe films deposited epitaxially on silicon substrates should achieve desirable results.

Nova Cut™ is a technique for film splitting after hydrogen implantation in the fabrication of SOI materials, Jason T. S. Lin et al., *Nova Cut™ Process: Fabrication of Silicon-on Insulator Materials*, 2002 IEEE International SOI Conference, Williamsburg, Va., (2002), U.S. Pat. No. 6,486,008 B1, granted Nov. 26, 2002, to Lee, for Manufacturing Method of a Thin Film on a Substrate. This process is very similar to the SmartCut™ process, however, the splitting is facilitated by microwave energy instead of heating. The Nova Cut™ technique, however, is only usable for SOI wafer fabrication. SiGe relaxation through application of microwave energy is not known to have been proposed.

SUMMARY OF THE INVENTION

A method of forming a SiGe layer having a relatively high Ge content includes preparing a silicon substrate; depositing a layer of strained SiGe to a thickness of between about 100 nm to 500 nm, wherein the Ge content of the SiGe layer is equal to or greater than 20%, by molecular weight; implanting H$_2^+$ ions into the SiGe layer; irradiating the substrate and SiGe layer, to relax the SiGe layer; and depositing a layer of tensile-strained silicon on the relaxed SiGe layer to a thickness of between 5 nm to 30 nm.

It is an object of the invention to provide a thick, relaxed, smooth SiGe film with high Ge content as a buffer layer for a tensile strained silicon film to be used for high speed MOSFET applications.

Another object of the invention is to provide high quality, low defect density relaxed SiGe film.

Another object of the invention is to produce a relaxed SiGe layer from a strained SiGe layer by hydrogen implantation plus microwave irradiation.

A further object of the invention is to provide better control of total irradiation time without temperature ramping-up and ramping-down.

Yet another object of the invention is to perform SiGe relaxation at low temperature.

Another object of the invention is to control the size and distribution of micro-$H_2$ bubbles, or cavities, to initiate the formation of dislocations.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention produces a thick, e.g., 100 nm to 500 nm, relaxed, smooth SiGe film having a relatively high Ge content, e.g., >20% to 30% molecular weight, or more, as a buffer layer for a tensile strained silicon film, to be used for high speed MOSFET applications. Atomic hydrogen ($H^+$) implantation, and singly ionized molecular hydrogen $H_2^+$, are effective for producing such films. Relaxation of SiGe layer is facilitated in the subsequent heating or thermal anneal step. An alternative technique to relaxed the strained SiGe layer by hydrogen implantation plus microwave irradiation is disclosed here. There are two advantages of this technique: (1) better control of total irradiation time without temperature ramping-up and ramping-down, and (2) relaxation at low temperature, which make it possible to control the size and distribution of micro-$H_2$ bubbles, or cavities, to initiate the formation of dislocations. This technique produces high quality, low defect density relaxed SiGe film.

Figure 1:
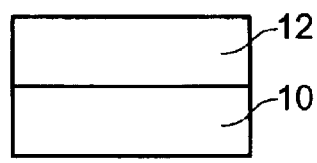
FIGS. 1–5 depicts successive steps in the method of the invention.

Referring initially to FIG. 1, a prime grade silicon wafer 10 of n-type or p-type is prepared. A layer 12 of strained SiGe is deposited to a thickness of about 100 nm to 500 nm on wafer 10 in a deposition chamber at room temperature, a pressure of between about 100 mTorr. to 5 Torr, and in a preferable atmosphere of $SiH_4$, $GeH_4$, or Ar, however, the atmosphere may also be $SiH_2Cl_2$, $H_2$, He, or $N_2$, or non-reactive mixtures thereof. The Ge content of layer 12 may be up to 30% or greater, but should be at least 20% molecular weight. Alternatively, a graded Ge profile may be used, having a Ge content of at least 20% at the SiGe/Silicon interface, increasing to 30%+ at the upper surface of the SiGe layer. The growth conditions and source gases are selected to minimize surface roughness, while ensuring good crystallinity. This usually means a low temperature growth, between about 400° C. to 600° C., to produce a metastable, strained SiGe film.

Figure 2:
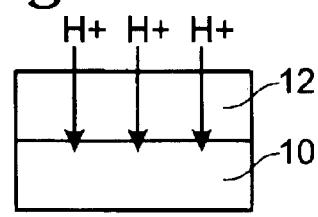

FIG. 2 depicts implantation of $H_2^+$ 14, with or without other species. Species, such as Boron, Helium, or Silicon, may be implanted before, after, or with the $H_2^+$ implantation. The dose of $H_2^+$ is in the range of between about $2e14$ cm$^{-2}$ to $2e16$ cm$^{-2}$, and depends on the dose of any co-implanted species, at an energy of between about 15 keV to 150 keV. The dose of the other species, e.g., boron, helium, or silicon, may have a fairly wide range, e.g., from between about $1e12$ cm$^{-2}$ to $1e15$ cm$^{-2}$. Generally, the higher the dose of the co-implanted species, the more the $H_2^+$ dose may be reduced. The implant energies depend on the thickness of SiGe layer 12, and are selected so that the implantation ranges are similar. To avoid contamination in the implantation steps, a thin sacrificial silicon oxide layer 16, having a thickness in the range of between about 50Å to 300 Å, may be deposited on SiGe layer 12.

Figure 3:
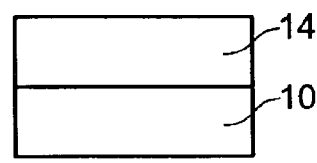

Microwave irradiation 18, as depicted in FIG. 3, is applied to convert strained SiGe layer 12 to a relaxed SiGe layer 12R. This step may be combined with a thermal anneal step. Relaxation is performed in a microwave oven, such as a commercial 2.45 GHz oven, at a power in the range of between about 200W to 2000W, for a time from between about 30 seconds to 30 minutes at about STP in air, $N_2$, Ar, or other inert gas. Alternatively, a low temperature pre-anneal, e.g., between about 250° C. to 400° C. for between about 10 minutes to one hour, could be used. The SiGe layer may be expected to be relaxed by at least 50%.

Figure 4:
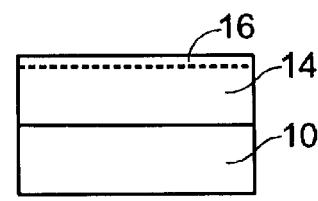

FIG. 4 depicts an optional step of depositing an additional relaxed SiGe layer 20, which has a thickness of at least 100 nm.

Figure 5:
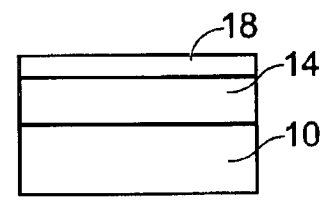

FIG. 5 depicts the epitaxial deposition of a tensile-strained silicon layer 22, having a thickness of between about 5 nm to 30 nm on relaxed SiGe layer 14R.

A series of experiments were performed to investigate the use of microwave irradiation to relax strained SiGe films. SiGe films having a thickness of approximately 300 nm were epitaxially grown on six-inch Si(001) wafers. The SiGe films had a graded Ge profile, varying linearly from about 20% at the SiGe/Si interface to about 30% at the wafer surface. The as-deposited films were strained to be lattice-matched to the silicon substrates. These wafers were then implanted with $1e16$ cm$^{-2}$ $H_2^+$ ions at an energy of about 58 keV. Finally, the test samples were exposed to microwave irradiation in a commercial microwave oven at 30 minutes. The microwave power was at the peak of the 1300W microwave oven.

Figure 6:
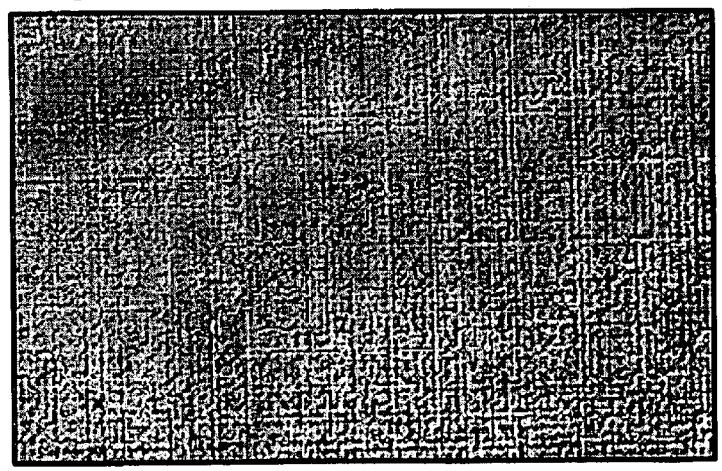
FIG. 6 is an XRD image of a wafer fabricated according to the method of the invention.
Figure 7:
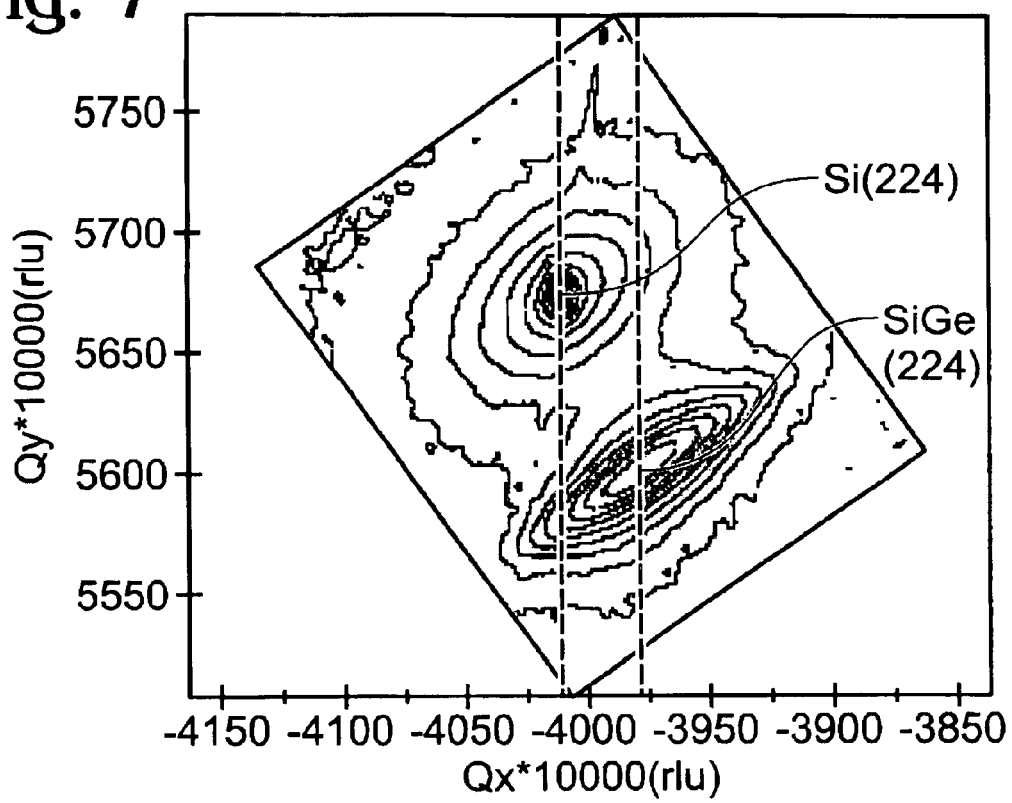
FIGS. 7 to 10 is a Nomarski image of the surface of the wafer of FIG. 6, at 1000×.
Figure 8:
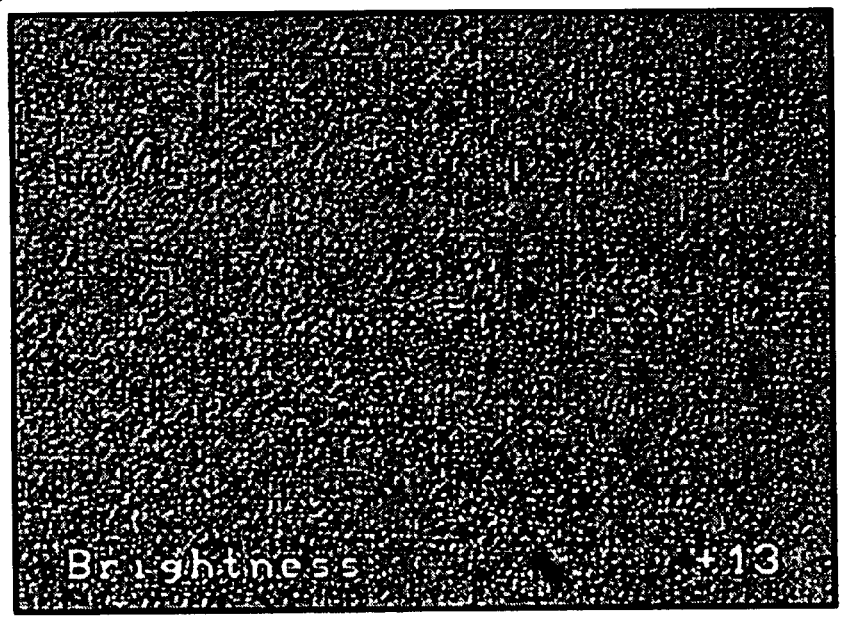
Figure 9:
Figure 10:
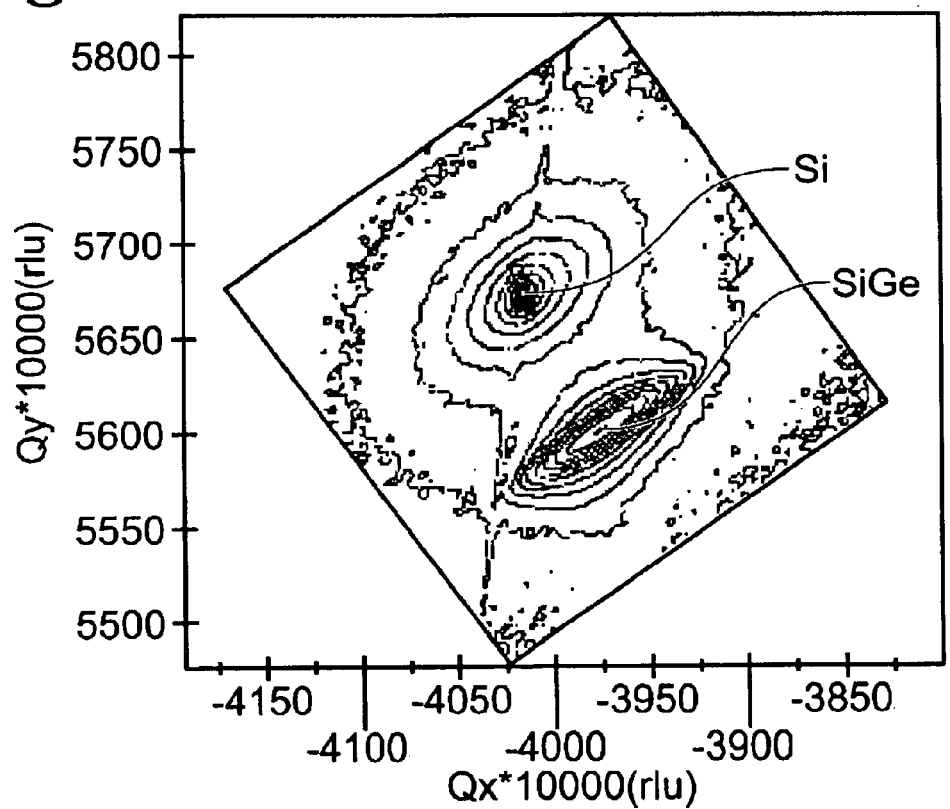

FIG. 6 depicts the x-ray diffraction (XRD) reciprocal space maps near the Si(224) substrate peak of the wafer, which shows a relaxation of about 56%. FIG. 7 depicts the Nomarski image of the wafer, which clearly indicates a surface modulation feature representative of SiGe relaxation. This relaxation is achieved only by microwave energy without any subsequent heating. Also, this is achieved in a commercial microwave oven without any modification. By adjusting microwave configuration to focus the energy on wafer, it is expected to achieve high degree of relaxation compatible or even better than relaxation from annealing.

Thus, a method for forming a relaxed SiGe layer by microwave irradiation has been disclosed. It will be appreciated that further variations and modifications thereof may be made within the scope of the invention as defined in the appended claims.

We claim:

1. A method of forming a SiGe layer having a relatively high Ge content, comprising:

preparing a silicon substrate;

depositing a layer of strained SiGe to a thickness of between about 100 nm to 500 nm, wherein the Ge content of the SiGe layer is equal to or greater than 20%, by molecular weight;

implanting $H_2^+$ ions into the SiGe layer;

irradiating the substrate and SiGe layer, to relax the SiGe layer; and depositing a layer of tensile-strained silicon on the relaxed SiGe layer to a thickness of at least 100 nm.

2. The method of claim 1 which further includes, prior to said implanting, depositing a layer of silicon oxide on the SiGe layer to a thickness of between about 5 nm to 30 nm.

3. The method of claim 1 which further includes, after said irradiating, depositing a layer of relaxed SiGe having a thickness of at least 100 nm on the relaxed SiGe layer.

4. The method of claim 3 which further includes depositing an epitaxial layer of tensile-strained silicon on the relaxed SiGe layer, wherein the tensile-strained SiGe layer has a thickness of between about 5 nm to 30 nm.

5. The method of claim 1 wherein said irradiating includes irradiating the substrate and SiGe layer at a power of between about 200W and 2000W for between about 30 seconds to 30 minutes.

6. The method of claim 1 wherein said implanting includes implanting $H_2^+$ ions at a dose of between about $1 \times 10^{16}$ cm$^{-2}$ to $5 \cdot 10^{16}$ cm$^{-2}$, at an energy of between about 15 keV to 150 keV.

7. The method of claim 1 which includes implanting $H_2^+$ ions and simultaneously implanting ions taken from the group of ions consisting of boron, helium and silicon.

8. A method of forming a SiGe layer having a relatively high Ge content, comprising:

preparing a silicon substrate;

depositing a layer of strained SiGe to a thickness of between about 100 nm to 500 nm, wherein the Ge content of the SiGe layer is equal to or greater than 20%, by molecular weight;

implanting $H_2^+$ ions into the SiGe layer at a dose of between about 2e14 cm$^{-2}$ to 2e16 cm$^{-2}$, at an energy of between about 15 keV to 150 keV;

irradiating the substrate and SiGe layer, to relax the SiGe layer, at about 2.45 GHz and at a power of between about 200W to 2000W for between about 30 seconds and 30 minutes; and depositing a layer of tensile-strained silicon on the relaxed SiGe layer to a thickness of between about 5 nm to 30 nm.

9. The method of claim 8 which further includes, prior to said implanting, depositing a layer of silicon oxide on the SiGe layer to a thickness of between about 5 nm to 30 nm.

10. The method of claim 8 which further includes, after said irradiating, depositing a layer of relaxed SiGe having a thickness of at least 100 nm on the relaxed SiGe layer.

11. The method of claim 8 which further includes implanting $H_2^+$ ions at a reduced dose and simultaneously implanting ions taken from the group of ions consisting of boron, helium and silicon.

12. A method of forming a SiGe layer having a relatively high Ge content, comprising:

preparing a silicon substrate;

depositing a layer of strained SiGe to a thickness of between about 100 nm to 500 nm, wherein the Ge content of the SiGe layer is equal to or greater than 20%, by molecular weight;

implanting $H_2^+$ ions into the SiGe layer at a dose of between about 2e14 cm$^{-2}$ to 2e16 cm$^{-2}$, at an energy of between about 15 keV to 150 keV;

irradiating the substrate and SiGe layer, to relax the SiGe layer to a relaxation of at least 50%; and depositing a layer of tensile-strained silicon on the relaxed SiGe layer to a thickness of between about 5 nm to 30 nm.

13. The method of claim 12 which further includes, prior to said implanting, depositing a layer of silicon oxide on the SiGe layer to a thickness of between about 5 nm to 30 nm.

14. The method of claim 12 wherein said irradiating includes irradiating the substrate and SiGe layer at a power of between about 200W and 2000W for between about 30 seconds to 30 minutes.

15. The method of claim 12 which further includes, after said thermal annealing, depositing a layer of relaxed SiGe having a thickness of at least 100 nm on the relaxed SiGe layer.

16. The method of claim 12 which further includes implanting $H_2^+$ ions at a reduced dose and simultaneously implanting ions taken from the group of ions consisting of Boron, Helium and Silicon.

* * * * *